(12) United States Patent
Hassan et al.

(10) Patent No.: US 10,686,092 B2
(45) Date of Patent: Jun. 16, 2020

(54) AVALANCHE PHOTODIODE

(71) Applicant: COMMISSARIAT A L'ENERGIE ATOMIQUE ET AUX ENERGIES ALTERNATIVES, Paris (FR)

(72) Inventors: Karim Hassan, Moneteau (FR); Salim Boutami, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/104,188

(22) Filed: Aug. 17, 2018

(65) Prior Publication Data
US 2019/0074397 A1 Mar. 7, 2019

(30) Foreign Application Priority Data

Aug. 25, 2017 (FR) ..................... 17 57874

(51) Int. Cl.
*H01L 31/107* (2006.01)
*H01L 31/02* (2006.01)
*H01L 31/0224* (2006.01)
*H01L 31/18* (2006.01)
(Continued)

(52) U.S. Cl.
CPC ............ *H01L 31/1075* (2013.01); *G02B 6/42* (2013.01); *H01L 31/02027* (2013.01); *H01L 31/02327* (2013.01); *H01L 31/022408* (2013.01); *H01L 31/107* (2013.01); *H01L 31/1812* (2013.01); *G02B 6/4295* (2013.01)

(58) Field of Classification Search
CPC ....... H01L 31/02027; H01L 31/022408; H01L 31/107; H01L 31/1075; H01L 31/03529; H01L 31/022416; H01L 31/035281
See application file for complete search history.

(56) References Cited

U.S. PATENT DOCUMENTS

| 2008/0193076 A1 | 8/2008 | Witzens et al. | |
| 2015/0076641 A1* | 3/2015 | Huang | H01L 31/022416 257/432 |
| 2015/0108327 A1* | 4/2015 | Huang | H01L 31/022408 250/200 |

OTHER PUBLICATIONS

French Preliminary Search Report dated May 14, 2018 in French Application 17 57874 filed on Aug. 25, 2017 (with English Translation of Categories of Cited Documents and Written Opinion).
(Continued)

*Primary Examiner* — David C Spalla
(74) *Attorney, Agent, or Firm* — Oblon, McClelland, Maier & Neustadt, L.L.P.

(57) ABSTRACT

The invention aims for an avalanche photodiode comprising an absorption zone (2), a multiplication zone (3), a first electrode and a second electrode. The photodiode further comprises a waveguide (10) forming a curved closed circuit capable of guiding a luminous flux over several turns of said circuit. The absorption zone extends over a portion at least of said waveguide, and the multiplication zone, the first and second electrodes extend along one part at least of the curved closed circuit. The waveguide is preferably an edge waveguide forming a ring and comprising an absorption zone made of germanium of width less than 200 nm. The photodiode according to the invention has an improved compacity and an improved bandwidth while limiting the multiplication noise.

19 Claims, 8 Drawing Sheets

(51) Int. Cl.
*H01L 31/0232* (2014.01)
*G02B 6/42* (2006.01)

(56) References Cited

OTHER PUBLICATIONS

Leopold Virot, et al., "Germanium avalanche receiver for low power interconnects," Nature Communications, Sep. 2014, pp. 1-6.
Gilles Denoyer, et al., "Hybrid Silicon Photonic Circuits and Transceiver for 50 Gb/s NRZ Transmission Over Single-Mode Fiber," Journal of Lightwave Technology, vol. 33, No. 6, Mar. 2015, pp. 1247-1254.
B. Szelag, et al., "Multiple wavelength silicon photonic 200mm R&D platform for 25GB/s and above applications," Proc. of SPIE vol. 9891, pp. 98911C-1-98911C-15.
Yimin Kang, et al., "Monolithic germanium/silicon avalanche photodiodes with 340 GHz gain-bandwidth product," Nature Photonics, vol. 3, Jan. 2009, pp. 59-63.
Léopold Virot, "Development of Ge on Si Avalanche Photodiodes for Low Signal and High Speed Detection", https://tel.archives-ouvertes.fr/tel-01136096, 2014, pp. 123-127 and 149-155 (English Translation only).

\* cited by examiner

AVALANCHE PHOTODIODE

TECHNICAL FIELD OF THE INVENTION

The invention relates to the field of photonics and optoelectronics. It has a particularly advantageous application in the field of avalanche photodiodes and more specifically, the field of SAM and/or SACM avalanche photodiodes (meaning "Separate Absorption and Multiplication regions" and "Separate Absorption, Charge and Multiplication regions" respectively, functioning for example in the near-infrared spectrum.

STATE OF THE ART

In the field of photonic near-infrared (IR) detection on silicon, a photodiode can generally comprise a silicon part and a germanium part. The silicon part, transparent in the near-infrared, can be used to guide near-IR photons to the germanium part. This germanium part is generally used to detect near-IR photons by absorption.

A principle of this detection is as follows: a photon is absorbed in germanium. The absorption of this photon generates an electron-hole pair. The electron and the hole can then be collected via the electrodes. The electric current generated by this electron and this hole, called charge carriers, can thus be utilised for detecting the photon at the start of the event.

To increase the sensitivity of such a detection, the electron can be subjected to a significant electrical so as to be highly accelerated and to ionise through impact of the surrounding atoms. These ionised atoms will themselves generate electrons which will also ionise other atoms, thus producing an event of multiplying electrons by ionisation, called an avalanche event.

An avalanche photodiode is advantageously based on this multiplication principle so as to increase the sensitivity of detection, and can thus detect luminous fluxes of very low intensity.

Ideally, the multiplication event occurs in a silicon part of the avalanche photodiode, generating very little multiplication noise.

The avalanche photodiode (APD) comprises an absorption zone, preferably made of germanium, separated from a multiplication zone, preferably made of silicon. This configuration is called SAM ("Separate Absorption and Multiplication regions").

In practice however, the multiplication event also occurs partially involuntarily in germanium. In this case, a significant multiplication event is generated and significantly limits the performance of photodetection and the avalanche photodiode.

In order to reduce this multiplication noise in germanium, an option can be the addition of a zone or of a layer called charge zone between the absorption zone and the multiplication zone, so as to reduce the electrical field in germanium while maintaining an electrical field that can be utilised in silicon. The share of carriers multiplied in germanium is thus reduced. The multiplication noise in germanium, also called noise excess factor, consequently decreases. This configuration is called SACM ("Separate Absorption, Charge and Multiplication regions").

The document "Développement de photodiodes à avalanche en Ge sur Si pour la detection faible signal et grande Vitesse" (Development of Ge avalanche photodiodes on Si for low and high-speed signal detection), Léopold Virot, doctorate thesis, University Paris Sud-Paris XI, 2014" discloses such an avalanche photodiode in SACM configuration.

In practice, with the avalanche photodiodes defined in this document, even in SACM configuration, the multiplication of the carriers in germanium remains significant.

To reduce the noise excess factor, a solution consists of reducing the volume of germanium. This reduction in volume is done however at the expense of absorption. This photodiode thus has reduced absorption capacities and a lower saturation threshold. This solution therefore leads to photodiodes having a detection range in limited intensity.

In the case of a lateral collection of charge carriers, in other words, along a direction parallel to a width of the germanium core, another solution consists of reducing the width of the germanium core by increasing the length of said core with a constant germanium volume. The increase in length however leads to a decrease in the compacity and the bandwidth of the photodiode.

An aim of the present invention is to overcome the disadvantages cited above.

In particular, an aim of the present invention is to propose an avalanche photodiode having an improved compacity and/or bandwidth, while limiting the noise excess factor.

Other aims, characteristics and advantages of the present invention will appear upon examining the following description and the supporting drawings. It is understood that other advantages can be incorporated.

SUMMARY OF THE INVENTION

To achieve this objective, a first aspect of the invention relates to an avalanche photodiode comprising an absorption zone, a multiplication zone, a first electrode and a second electrode.

Advantageously, the photodiode further comprises a waveguide forming a closed circuit, capable of guiding a luminous flux over several turns of said circuit.

The absorption zone extends over at least one portion of said curved closed circuit. The multiplication zone, the first and second electrodes extend along a part at least of said curved closed circuit.

The luminous flux can thus be propagated within the waveguide over several turns of the closed circuit. Subsequently, the absorption capacities of the absorption zone of the photodiode are preserved, whereas the volume of said absorption zone, preferably the volume of germanium forming the absorption zone, is reduced.

The compacity of the photodiode is advantageously improved.

Furthermore, the first and second electrodes have a length dimension shorter than or substantially equal to a perimeter of the curved closed circuit. This length dimension, in particular the length dimension of the electrode collecting the electrons, proportionally impacts a capacity of the photodiode, said capacity being inversely proportional to the bandwidth of the photodiode.

Subsequently, it is particularly advantageous to decrease or limit the electrode length so as to increase the bandwidth of the photodiode.

In particular, for a fixed electrode length, the capacity of the photodiode and therefore the bandwidth of the photodiode remain advantageously constant whatever the number of turns covered by the luminous flux within the waveguide.

The distance covered by the luminous flux within the absorption zone, in particular the distance necessary for the complete absorption of said luminous flux, can therefore be greater than the electrode length necessary for the collection of the electrons generated during said absorption, in particular when the luminous flux covers at least one turn within the waveguide.

In this case, the photodiode according to the invention advantageously enables to absorb and to detect the luminous flux without decreasing the bandwidth of said photodiode.

The photodiode according to the invention therefore advantageously has a compacity and a bandwidth that are simultaneously improved, most specifically when the luminous flux is led to cover at least one turn within the waveguide.

Advantageous but only optional characteristics of the photodiode according to the invention will now be stated below.

Preferably, such that a luminous flux can cover at least one turn of the waveguide, the latter can advantageously have a small bend radius, for example, between 5 µm and 20 µm.

According to an option, the collection of electrons can be done by an electrode positioned laterally opposite the absorption and multiplication zones. The absorption zone, the multiplication zone and the collection electrode can advantageously extend concentrically over a base plane.

The electrons generated in the absorption zone are thus accelerated along a direction parallel to the base plane and orthogonal to a propagation direction of the luminous flux, in a width of the absorption zone, before being multiplied in the multiplication zone and collected by the collection electrode.

In this case, it is particularly advantageous to limit the width of the absorption zone so as to reduce the multiplication noise excess factor in this absorption zone.

According to an embodiment, the width of the absorption zone can advantageously be less than 200 nm, preferably less than 100 nm. In germanium for example, the multiplication by ionisation event becomes marginal for a germanium width less than 100 nm.

To compensate for this reduction in the width of the absorption zone, the photodiode can be configured to guide the propagation of the luminous flux over a greater distance within the absorption zone.

The propagation of the luminous flux is guided by the waveguide.

Preferably, the waveguide comprises a core and a sleeve so as to geometrically confine the luminous flux at the level of the core of the waveguide.

The waveguide can be made of intrinsic silicon so as to limit optical losses during the guiding of the luminous flux. The core and the sleeve are subsequently at least partially made of intrinsic silicon.

For an index contrast waveguide between the core and the sleeve, the width of the absorption zone can be substantially equal to the width of the core of the waveguide. In this case, the core can be made of germanium and the sleeve can be at least partially made of intrinsic silicon.

For a reduced absorption zone width however, such an index contrast waveguide no longer guides the propagation of the luminous flux effectively.

According to a preferred and particularly advantageous option, the waveguide can subsequently be an edge guide type guide. Such an edge guide enables to confine the luminous flux geometrically.

For a reduced absorption zone width, the propagation of the luminous flux can therefore be advantageously guided effectively by an edge guide.

The photodiode according to the invention can thus enable to reduce the noise excess factor in the absorption zone while having an improved compacity and an improved bandwidth.

In contrast, the solutions of the prior art taught by the document "Développement de photodiodes à avalanche en Ge sur Si pour la détection faible signal et grande Vitesse" ("Development of Ge avalanche photodiodes on Si for low and high-speed signal detection"), thesis by Léopold Virot mentioned above, suggest linearly increasing the length of the absorption zone and of the collection electrode of the photodiode, at the expense of the compacity and of the bandwidth of said photodiode.

A second aspect of the present invention relates to a method for producing an avalanche photodiode according to the first aspect of the invention.

The production method in particular comprises the following steps:
Providing a silicon on insulator (SOI) type substrate comprising an upper layer made of silicon (Si),
Lithography so as to define the limits of the absorption zone in a plane xy,
Etching an axis z of a part only of the thickness of the upper layer, so as to form a cavity delimited by the limits of the absorption zone defined by lithography,
Depositing germanium (Ge), preferably by epitaxy, in said cavity so as to form the absorption zone,
Lithography so as to define the limits of the waveguide according to a curved closed circuit comprising the absorption zone,
Etching along an axis z of a part of the thickness of the silicon surrounding said limits of the waveguide, so as to form at least one part of the waveguide, preferably so as to form at least one part of an edge guide type guide,
Forming electrodes at the level of contact zones situated on either side of the waveguide.

The photodiode according to the invention can advantageously equip an infrared photodetector in the field of photonics on silicon.

BRIEF DESCRIPTION OF THE FIGURES

The aims, objectives, as well as the characteristics and advantages of the invention will best emerge from the detailed description of embodiments of the latter, which are illustrated by the following supporting drawings wherein.

Figure 1:
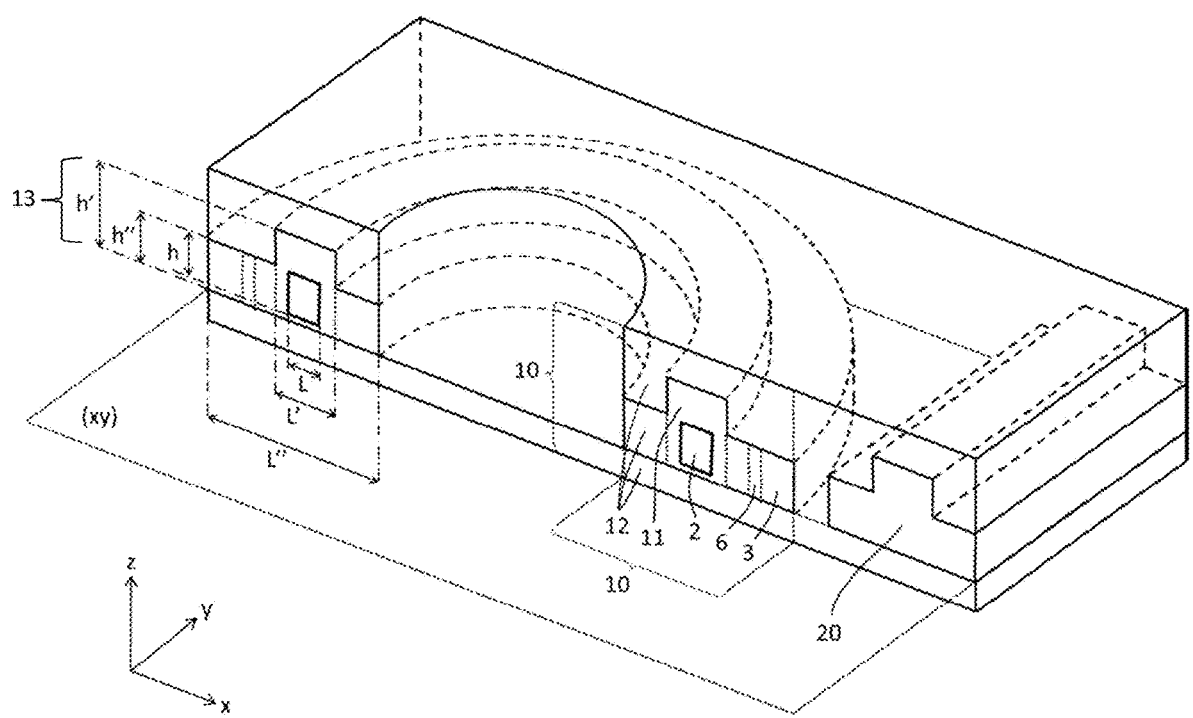
FIG. 1 is a perspective view of a cross-section of a ring-shaped guide according to a non-limiting embodiment of the present invention.

The drawings are given as examples and are not limiting of the invention. They constitute schematic representations of principle, intended to facilitate the understanding of the invention and are not necessarily to the scale of practical applications. In particular, the thicknesses and dimensions of the different layers and portions of the photodiodes illustrated, are not representative of the reality.

DETAILED DESCRIPTION OF THE INVENTION

The invention according to the first aspect thereof, in particular comprises the optional characteristics below, which could be used in association or alternatively:
  According to an example, the absorption zone, the multiplication zone, the first electrode and the second electrode extend respectively:
    along a curved profile of a circuit a, also called curved portion of a circuit a,
    a curved profile of a circuit b, also called curved portion of a circuit m,
    a curved profile of a circuit e1, also called curved portion of a circuit e1 and
    a curved profile of a circuit e2, also called curved portion e2 of a circuit, said curved profiles of said circuits a, m, e1 and e2 being parallel to one another over a part at least of the respective lengths thereof and parallel to said base plane xy.
  According to an example, said portions along which the multiplication zone, the first and second electrodes extend, partially correspond at least to said portion along which said absorption zone extends.
  According to an example, said portions along which the multiplication zone, the first and second electrodes extend, are situated at least partially opposite said portion along which said absorption zone extends.
  According to an example, the absorption zone forms at least one portion of a first oval circuit and the multiplication zone forms at least one portion of a second oval circuit, such that said first and second oval circuits are concentric or more generally, have the barycentres thereof combined.
  According to an example, the guide is curved. It is closed up on itself.
  According to an example, the guide has a symmetry around an axis. According to another example, the guide does not have any specific symmetry.
  According to an example, the first and second oval circuits are taken from among: elliptical circuits, oblong-shaped circuits.
  According to an example, the first and second oval circuits are circular circuits.
  According to an example, the circular circuits have a bend radius of between 5 µm and 20 µm.
  Such a range of bend radii advantageously enables to favour a propagation of the luminous flux over several turns of the waveguide, while limiting radiative losses by bending. This range further enables a strong compacity of the photodiode.
  According to an example, the waveguide comprises a core and a sleeve and the absorption zone is situated at least partially at the level of said core.
  This arrangement optimises a covering between the absorption zone and the luminous flux, said luminous flux being confined to the level of the core.
  According to an example, the core comprises a guide material, preferably silicon, different from a material of the absorption zone. The guide material fully surrounds the absorption zone.
  According to an example, the absorption zone has a height h substantially equal to a height h' of the multiplication zone.
  According to an example, the absorption zone is contained in a first set of planes and the multiplication zone is contained in a second set of planes. The planes of the first and second sets are parallel to the base plane xy. At least some of the planes of the first and second sets are identical. Thus, over a portion at least, the height h and h" thereof, taken along a direction z perpendicular to the base plane xy, the absorption zone and the multiplication zone are contained in coplanar planes.
  In projection into each of the planes which are parallel to the base plane xy, and which pass both through the absorption layer and through the multiplication layer, the absorption layer and through the multiplication layer are concentric.
  In projection into each of the planes which are parallel to the base plane xy, and which pass both through the absorption layer and through the charge zone, the absorption layer and through the charge zone are concentric.
  According to an example, the absorption zone 2 and the multiplication zone 3, extend respectively along a curved portion of a circuit a and a curved portion of a circuit m, and in projection along the base plane (xy):
    said curved portions of said circuits a, m, are parallel to one another over a part at least of the respective lengths thereof, and
    the curved portion of the circuit a is situated inside the curved portion of the circuit m.
  The first electrode 4 and the second electrode 5 extend respectively along a curved portion of a circuit e1 and a curved portion of a circuit e2. In projection over the base plane (xy):
    the curved portion of the circuit e1 of the first electrode is situated inside, preferably fully inside, the curved portion of the circuit a of the absorption zone,
    the curved portion of the circuit a of the absorption zone is situated inside, preferably fully inside, the curved portion of the circuit m of the multiplication zone,
    the curved portion of the circuit m of the multiplication zone is situated inside, preferably fully inside, the curved portion of the circuit e2 of the second electrode.
  According to an example, in projection over the base plane (xy), the multiplication zone and the first electrode are situated on either side of the absorption zone.
  The multiplication zone is not situated directly above, in other words above or below, the absorption zone along a direction z perpendicular to the base plane xy.
  According to an example, in projection over the base plane (xy), the absorption zone is situated remotely from the multiplication zone.

According to an example, in projection over the base plane (xy), the charge zone and the first electrode are situated on either side of the absorption zone.

According to an example, the charge zone is not situated directly above, in other words above or below, the absorption zone along a direction z perpendicular to the base plane xy.

According to an example, in projection over the base plane (xy), the absorption zone is situated remotely from the charge zone.

According to an example, along a cross-section perpendicular to the base plane xy and passing through the perpendicular to the tangent at the curved closed circuit c, the absorption zone is opposite, preferably fully opposite, the multiplication zone.

According to an example, along a cross-section perpendicular to the base plane xy and passing through the perpendicular to the tangent at the curved closed circuit c, the absorption zone is opposite, preferably fully opposite, the charge zone.

According to an example, the absorption zone and the multiplication zone are contained, at least partially, in planes identical and parallel to the base plane xy.

According to an example, the absorption zone and the charge zone are contained, at least partially, in planes identical and parallel to the base plane xy.

According to an example, the absorption zone is opposite the multiplication zone along a plane parallel to the base plane xy.

According to an example, the absorption zone is opposite the charge zone along a plane parallel to the base plane xy.

According to an example, the absorption zone and the multiplication zone are opposite one another along a direction parallel to the base plane xy and perpendicular to the tangent at the curved closed circuit c. The absorption zone and the multiplication zone mainly extend along curved portions parallel to one another and parallel to said base plane xy and the heights h and h", are measured along a direction which is perpendicular to said base plane xy.

This embodiment enables to facilitate the horizontal extraction of the electrical charges, parallel to the base plane xy, through the electrical field applied.

According to an example, the multiplication zone is fully comprised in the slab.

According to an example, the charge zone is fully comprised in the slab.

According to an example, the photodiode comprises said two electrodes only. It does not comprise a third electrode which would generate losses.

According to an example, the absorption zone forms a curved closed circuit, and the first electrode and the multiplication zone are situated on either side of the curved closed circuit formed by the absorption zone.

According to an example, the core comprises a guide material, preferably silicon, different from a material of the absorption zone. The guide material surrounds only one part of the absorption zone, and the sleeve surrounds one complementary part of the absorption zone.

According to an example, the waveguide is an edge guide type guide (RIB). The confinement of the luminous flux can this be purely geometric, it is therefore not necessary to configure the absorption zone so as to confine the luminous flux.

According to an example, the absorption zone forms a curved closed circuit, and the first and the second electrode are situated on either side of the absorption zone. Preferably, the second electrode fully surrounds said curved closed circuit formed by the absorption zone.

This embodiment enables to absorb a maximum luminous flux at the level of the absorption zone at each turn made by the luminous flux within the waveguide.

According to an example, the absorption zone forms a curved closed circuit such that the waveguide has a portion free from the absorption zone, and the first and second electrode are not situated on either side of said waveguide portion free from the absorption zone.

This embodiment enables to avoid uselessly generating charges at the level of a portion of the waveguide not bordered by an electrode, the collection of charges at the level of this portion indeed being small or zero. The effectiveness of detecting the photodiode can thus be improved.

Furthermore, with the luminous flux not being absorbed on this portion, a larger distance or a higher number of turns within the photodiode can arise. The bandwidth of the photodiode can thus be improved.

According to an example, the absorption zone has a width L<200 nm, preferably L<100 nm, the absorption zone extending parallel to the base plane xy, in other words, the absorption zone extends mainly, and preferably fully, in the planes parallel to the base plane xy. The width L, in a given point, being measured along a direction which is parallel to said base plane xy and which is perpendicular to a tangent, in this given point, to the absorption zone.

An absorption zone having such a width L enables to minimise the excess noise factor. This embodiment enables to obtain a photodiode with the width of a thin absorption zone, preferably with the width of thin Ge.

According to an example, the absorption zone extends mainly, and preferably fully, in the planes parallel to the base plane xy.

According to an example, the absorption zone forms a first curved closed circuit having a length $l_1$ and the multiplication zone forms a second curved circuit bordering the first curved circuit and having a length $l_2$. According to an example, $l_2 \geq l_1$, the lengths $l_1$ and $l_2$ being measured in said base plane xy. According to another example $l_2 < l_1$.

According to an example, the absorption zone forms a first curved circuit having a length $l_1$, and the curved closed circuit c has a length $l_c$, the lengths $l_1$ and $l_c$ being measured in said base plane xy, such that:

$$\gamma_1 \cdot l_c \leq l_1 \leq \gamma_2 \cdot l_c$$

with $\gamma_1 \geq 0.5$ and $\gamma_2 = 1$, preferably $\gamma_1 = 0.7$.

According to an example, the first electrode is situated inside the curved closed circuit and the second electrode is situated outside the curved closed circuit, in projection in a base plane xy.

According to an example, the multiplication zone and the absorption zone are opposite one another along a direction perpendicular to the tangent to the curved closed circuit c and parallel to said base plane xy. The multiplication zone and the absorption zone extend along the planes parallel to said base plane xy and substantially concentrically.

According to an example, the first and second electrodes are disposed on either side of said absorption and multiplication zones, at least in projection in said base plane xy.

According to an example, the first electrode and the multiplication zone are disposed on either side of the absorption zone.

This embodiment enables to obtain a lateral photodiode.

According to an example, the photodiode further comprises a charge zone interleaved between the absorption zone and the multiplication zone.

In the case of a lateral photodiode, the charge layer enables to reduce the multiplication noise without affecting the propagation of the luminous flux, and in particular, without inducing optical losses.

In the case of a photodiode with the width of a thin absorption zone, the charge layer enables to limit or suppress a bandwidth decrease linked to a low-voltage functioning of the photodiode.

The multiplication zone and the charge zone extend along planes parallel to said base plane xy, and substantially concentrically.

According to an example, the absorption zone is in contact with the multiplication zone.

This embodiment enables to reduce the complexity and the cost of obtaining the photodiode, since the production of the charge zone, usually thin, is complex to produce, in practice.

According to an example, the photodiode further comprises an inlet guide configured to form an evanescent coupling with the waveguide so as to guide the luminous flux from the outside of said waveguide until the inside of said waveguide.

The method according to the invention can comprise, in particular, the optional characteristics below, which could be used in combination or alternatively:

According to an embodiment, the method comprises the following step, carried out after said deposit of germanium (Ge) and before said lithography, so as to define the limits of the waveguide along a curved closed circuit comprising the absorption zone:

Deposit of silicon (Si), preferably through epitaxy, on said upper layer and on the absorption zone.

According to an embodiment, the method comprises the following steps:

Deposit of silicon, preferably through epitaxy, on said upper layer and on the absorption zone.

Chemical-mechanical polishing, successive to the epitaxy of germanium.

Chemical-mechanical polishing, successive to the epitaxy of silicon.

Encapsulation of the core of the waveguide in an encapsulation layer, for example by depositing of $SiO_2$.

To determine a propagation mode and/or a position of a luminous flux propagating in the curved waveguide, and to determine the optical losses during the propagation of the luminous flux within this guide for example, a simulation can be proceeded with. For this, the following can be used:

FEMs (Finite Elements Methods). The Comsol software, for example, enables to use such a method, BPMs (Beam Propagation Methods). The Rsoft software, for example, enables to use such a method, FDTD (Finite Difference Time Domain) optical simulation methods.

Subsequently, the photodiode preferably has a configuration called SAM or SACM. These configurations are in particular based on a separation of the absorption, charge (for the SACM configuration) and multiplication zones.

An absorption zone is a zone configured to partially absorb at least the luminous flux and generate electrical charges, said generation of charges resulting from the absorption event. The absorption zone is preferably made of germanium.

A multiplication zone is a zone configured to multiply the electrical charges generated in the absorption zone. This multiplication can be done through ionisation by impact of the atoms from the multiplication zone. This ionisation by impact can be triggered and assisted by a high polarisation voltage within said multiplication zone.

A charge zone is a zone configured to shield an electrical field developing in the multiplication zone, opposite the absorption zone. This charge zone has the function of reducing, at the level of the absorption zone, the speed of the charges accelerated by said electrical field in the direction of the multiplication zone. In particular, the speed of the charges accelerated in the absorption zone is limited by the charge zone, such that said speed remains less than a threshold beyond which the ionisation significantly occurs in the absorption zone.

In the present invention, doping types will be indicated. These dopings are non-limiting examples. The invention covers all embodiments wherein dopings are reversed. Thus, if an example of an embodiment mentions, for a first zone, a doping p and for a second zone, a doping n, the present description thus defines, implicitly at least, the reverse example wherein the first zone has a doping n and the second zone has a doping p.

The doping ranges associated with the different types of doping are as follows:

doping p+: $1\times10^{18}$ cm$^{-3}$ to $1\times10^{20}$ cm$^{-3}$ with a nominal value of $1\times10^{19}$ cm$^{-3}$ doping n+: $1\times10^{18}$ cm$^{-3}$ to $1\times10^{20}$ cm$^{-3}$ with a nominal value of $1\times10^{19}$ cm$^{-3}$ doping p: $1\times10^{17}$ cm$^{-3}$ to $1\times10^{18}$ cm$^{-3}$ with a nominal value of $5\times10^{17}$ cm$^{-3}$ intrinsic doping: $1.10^{15}$ cm$^{-3}$ to $1.10^{17}$ cm$^{-3}$ with a nominal value of $1\times10^{16}$ cm$^{-3}$ It is specified that, in the scope of the present invention, the terms "on", "surmounts", "covers", "underlying", "opposite" and the equivalents thereof do not necessarily mean "in contact with". Thus, for example, the deposit of a first layer on a second layer, does not compulsorily mean that the two layers are directly in contact with one another, but means that the first layer covers, at least partially, the second layer, either by being directly in contact with it, or by being separate from it, by at least one other layer or at least one other element.

A layer can moreover be composed of several sublayers made of one same material or from different materials.

In the scope of the present patent application, a flat, closed curve having a centre, or more generally, a barycentre, is called oval. The oval or the oval circuit also means a flat, closed geometric shape having a non-zero surface.

In particular, the oval extends from the most general shape comprising ellipses, circles and oblong shapes, in particular.

Two shapes are called concentric if they overlap into one another in one same plane, or at least in projection in one same plane, and if they have a common centre or barycentre.

Below, the invention is defined and illustrated through one specific case of a ring shape. The ring shape however is not limiting. The invention also covers embodiments comprising oval shapes.

In particular, the elliptic shape and the oblong shape are two alternatives to the ring shape that are covered by the invention. Thus, all the characteristics and technical effects defined in reference to the ring embodiments are applied also to other oval forms.

Figure 3A:
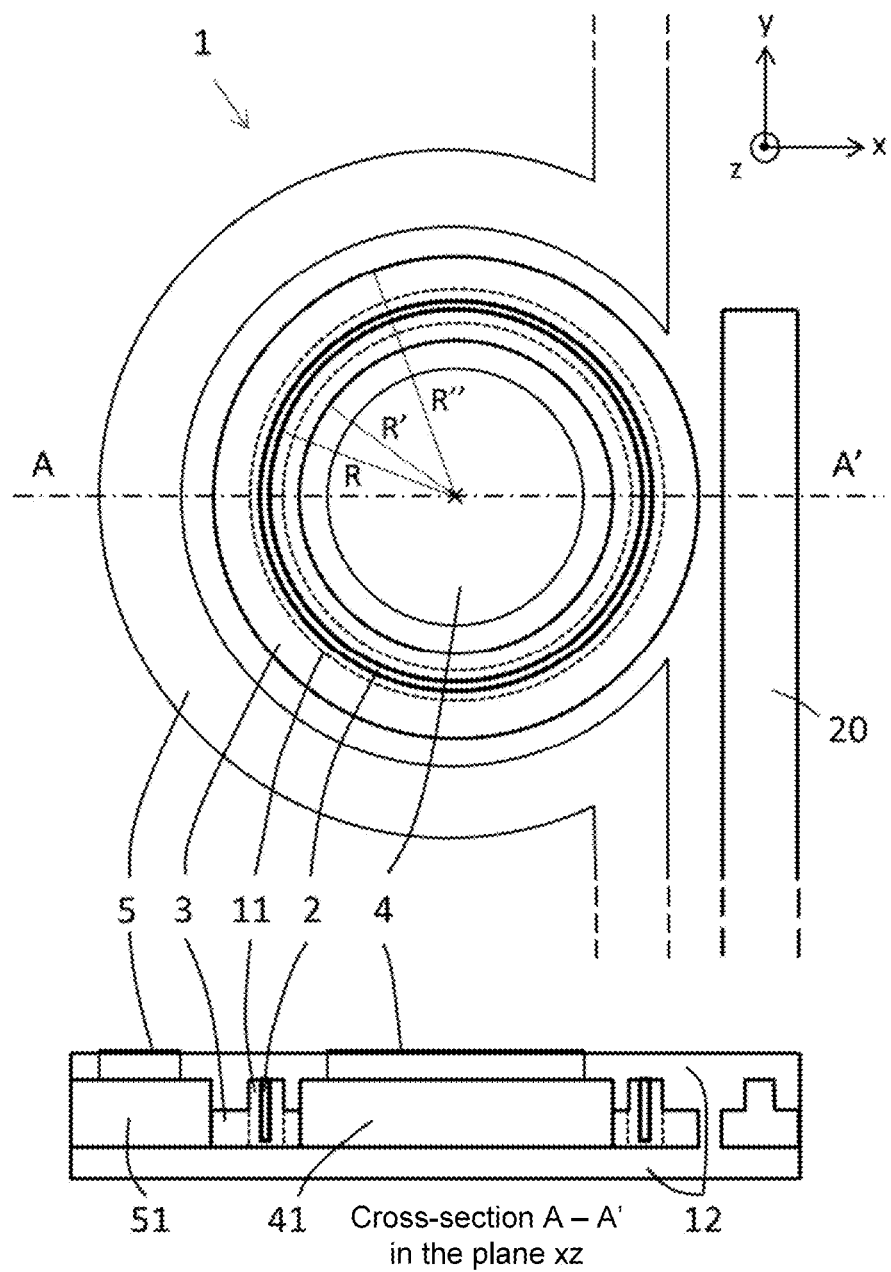
FIG. 3a is a top view of a photodiode according to an embodiment of the present invention wherein the absorption zone forms a closed circuit.
Figure 3B:
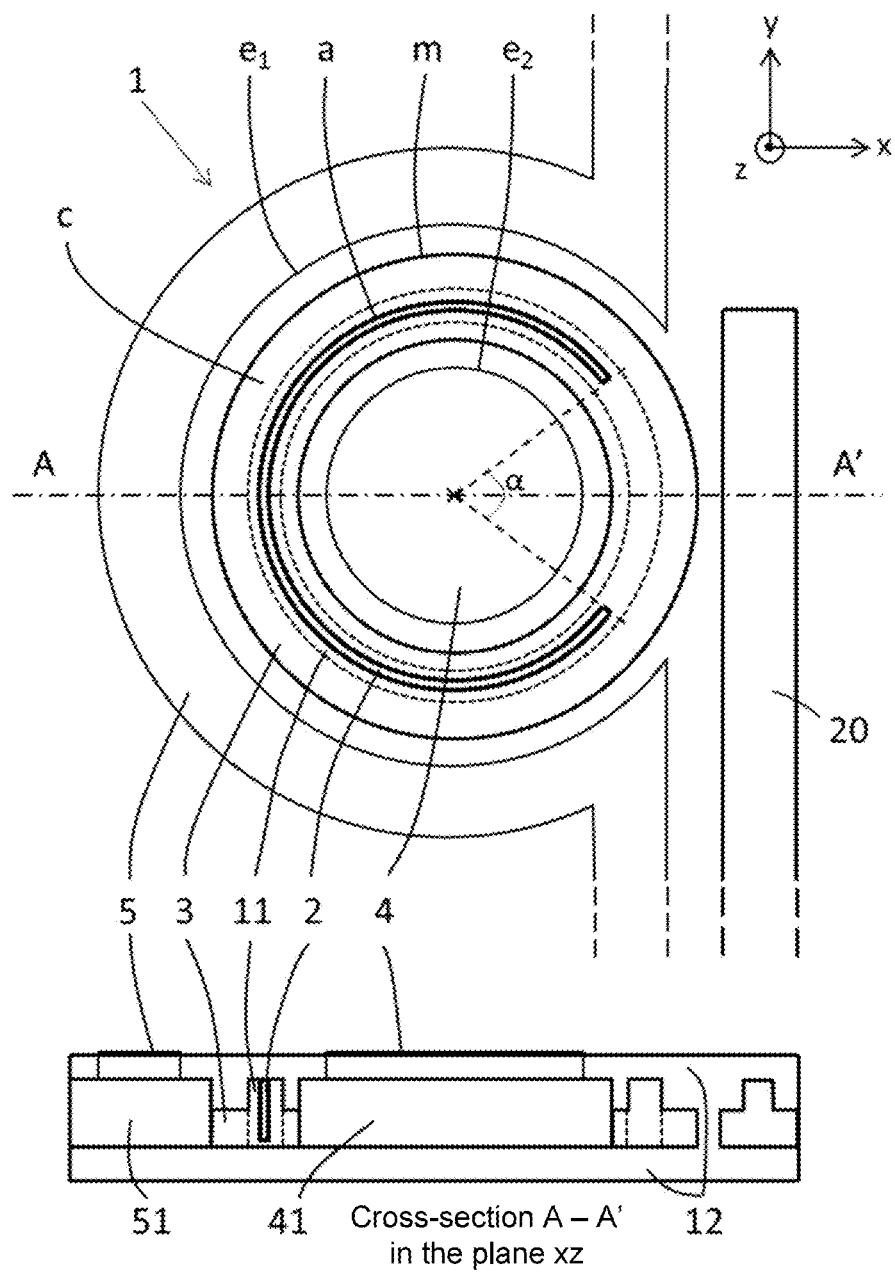
FIG. 3b is a top view of a photodiode according to another embodiment of the present invention wherein the absorption zone forms an open curve.

A first embodiment of an avalanche photodiode according to the invention will now be defined in reference to FIGS. 1, 3a and 3b.

As illustrated in a cross-section in FIG. 1, the photodiode advantageously comprises a waveguide 10 having an oval shape, and more specifically, a ring shape in this figure, without this ring shape being limiting.

The waveguide 10 extends mainly in one plane. This plane is parallel to the base plane xy of the orthogonal marker xyz illustrated in FIGS. 1 and 3a to 5.

The waveguide 10 comprises a core 11 and a sleeve 12. The sleeve 12 surrounds the core 11 wherein most of the luminous flux propagates. Typically, at least 70% and preferably at least 80% of the luminous flux propagates inside the core 11.

The waveguide 10 is preferably an edge guide, also called a RIB guide.

In the cross-section in a plane perpendicular to the main direction of propagation of the luminous flux, the RIB guide can have various shapes. In the example illustrated in FIG. 1, the RIB guide 10 has a reverse T-shape.

In particular, the RIB guide 10 comprises a lower part surmounted by an upper protruding part.

The lower part extends mainly in the base plane xy between two concentric circles of said base plane xy. In particular, the lower part is comprised between an inner circle of radius R' and an outer circle of radius R", such as R'<R". The lower part has a height h" along the axis z and a width L" along a radial direction such that L"=R"−R'.

The height h" can be between 100 nm and 300 nm. The radii R' and R" can be between 5 µm and 25 µm, and the width L" can be between 500 nm and 2 µm.

The lower part and the upper protruding part are preferably made of intrinsic silicon.

The core 11 of such a RIB guide 10 extends vertically from a lower horizontal flank of the lower part until an upper horizontal flank of the upper protruding part, over the whole height of the T. This height along the axis z is referenced h'.

The core 11 extends horizontally between two vertical surfaces, each comprises a vertical flank opposite the upper protruding part.

The core 11 therefore comprises the upper protruding part and a portion of the lower part, said portion being situated to the right of the upper protruding part.

The core 11 has a width along a radial direction referenced L'.

The height h' can be between 200 nm and 500 nm. The width L' can be between 150 nm and 400 nm.

The sleeve 12 of the waveguide 10 extends around the core 11.

The sleeve 12 can in particular comprise the two portions of the T situated on either side of the core 11.

Such a ring-shaped RIB guide 10 is advantageously configured to confine and to propagate a luminous flux at the level of the core 11. This confinement can be purely geometric.

The core 11 of the guide 10 can be advantageously functionalised.

In particular, it can advantageously comprise an absorption zone 2 of the photodiode, such that said absorption zone 2 can receive a significant part of the luminous flux propagating in the guide 10.

The absorption zone 2 is preferably made of intrinsic germanium.

The absorption zone 2 extends mainly in the base plane xy. It forms a ring portion or a complete ring, in other words, a closed ring. The radius of the ring is referenced R, such that R'<R<R".

The absorption zone 2 can be of rectangular cross-section. The absorption zone 2 has a height h along the axis z and a width L along a radial direction.

The height h can be between 50 nm and 450 nm. The width L can be between 40 nm and 300 nm. The radius R can be between 5 µm and 25 µm.

In the embodiment illustrated in FIG. 1, the absorption zone 2 is called "non-crossing", in other words, it is fully surrounded by the material for guiding the core 11, in other words, the intrinsic silicon in this example. In particular, the absorption zone 2 can be comprised in the lower part of the reverse T, such that h≈h". This configuration enables the electrical charges generated in the absorption zone 2 to travel horizontally for an electrical field applied parallel to the base plane xy. The extraction of the charges is thus facilitated.

According to another possibility, the absorption zone 2 is called "crossing", and can cross the lower part and the upper protruding part of the core 11, such that h≈h'. According to this possibility, the absorption zone 2 extends over the whole height of the core 11 of the waveguide 10 except for a lower silicon layer, situated under the absorption zone 2 and which is useful for growth through epitaxy of the absorption zone 2 made of germanium. Thus, in this embodiment, an upper face of the absorption zone 2 is not covered by the material for guiding the core, in other words, intrinsic silicon in this example. This configuration enables to increase the volume of germanium for a fixed width of the absorption zone 2.

A part of the core 11 and/or of the sleeve 12, situated over a perimeter of the absorption zone 2, can advantageously comprise a multiplication zone 3 of the photodiode. In particular, the multiplication zone 3 is situated in the lower part of the reverse T, also called a "slab". Preferably, the multiplication zone 3 is fully contained in the slab 13. The height of the slab, take along the direction z is h".

The multiplication zone 3 and the absorption zone 2 can subsequently be coplanar in the base plane xy, and can advantageously be concentric, or have more generally, a common barycentre.

In particular, the outer vertical flank of the absorption zone 2 can be opposite the inner vertical flank of the multiplication zone 3, along a direction parallel to the plane xy, over most of the respective heights of said zones 2, 3.

The photodiode having such an arrangement relative to the absorption and multiplication zones 2, 3 is called a lateral SAM photodiode.

In particular, the multiplication zone 3 can follow the absorption zone 2 over an outer perimeter of it. Said zones 2, 3 subsequently form two concentric rings. These rings can be closed as illustrated in FIG. 3a or can, on the contrary, be open, in other words partial, as illustrated in FIG. 3b.

According to a possibility, the height of the multiplication zone 3 is equal to h" so as to optimise the event of multiplying the carriers. This configuration is illustrated in FIG. 1.

The multiplication zone 3 is preferably made of intrinsic crystalline silicon.

A part of the sleeve 12 at the level of the lower part of the reverse T (in the slab) can further be functionalised by ionic implantation, to create a charge zone 6, for example.

The charge zone 6 can be made of doped silicon p and can form at least one ring part, interleaved between the absorption zone 2 and the multiplication zone 3. The charge zone 6 can have a width of between 0 and 200 nm and a height equal to h". Preferably, the charge zone 6 is fully contained in the slab 13.

The absorption zone 2, the charge zone 6 and the multiplication zone 3 can subsequently be concentric or have more generally a common barycentre.

In particular, the outer vertical flank of the absorption zone 2 can be opposite the inner vertical flank of the charge zone 6 along a direction parallel to the plane xy, and the outer vertical flank of the charge zone 6 can be opposite the inner vertical flank of the multiplication zone 3, along a direction parallel to the plane xy, over most of the respective heights of said zones 2, 3, 6.

The photodiode having such an arrangement relative to the absorption, charge and multiplication zones 2, 6, 3 is called a lateral SACM photodiode.

The charge zone 6 can enable to advantageously reduce the ionisation rate in the germanium (where the excess noise factor of multiplication is increased) from the absorption zone 2, while maintaining a significant ionisation rate in the silicon (where the noise of multiplication is low) from the multiplication zone 3.

This contributes to optimising the noise sources of multiplication, so as to reduce the excess noise factor.

However, the ionisation rate in germanium can be low, even substantially zero over a distance d (also called "dead space") covered by the electrons within the germanium. This distance d is measured along a direction parallel to the plane xy and perpendicular to the main direction of propagation of the luminous flux. This direction is radial in the case of an annular absorption zone 2 such as illustrated in FIG. 1. In germanium, the distance d is around 100 nm.

Subsequently, it can be particularly advantageous to have an absorption zone 2 made of germanium of width L≤d. In this non-limiting example, therefore L≤100 nm would be had. In this configuration, the charge zone 6 is no longer necessary.

A SAM photodiode having a width of absorption zone 2 made of germanium, of L≤d can therefore offer a performance similar to an SACM photodiode in terms of excess noise factor of multiplication, while being advantageously easier to produce.

The photodiode according to the invention advantageously enables to compensate for a reduction in width of the absorption zone 2 by confining the luminous flux within a closed circuit, such as the ring-shaped RIB waveguide 10, so as to absorb all of said luminous flux.

Thus, as clearly illustrated in FIG. 1, the photodiode is of the lateral photodiode type.

In particular, the absorption layer 2, the multiplication layer 3 and the charge layer 6, if it is present, are partially at least contained in identical planes, parallel to the base plane xy and are concentric in these planes.

Thus, over a portion at least of the height h and h" thereof, taken along a direction z, perpendicular to the base plane xy, and in each point of the curved closed circuit c, the absorption zone 2 is opposite, preferably fully opposite, the multiplication zone 3 along a direction parallel to the base plane xy and perpendicular to the tangent to the curved closed circuit c in this point.

In the example illustrated in FIG. 1, h is less than h". The absorption zone 2 is thus fully contained in the superposed planes also containing a part of the multiplication zone 3, these planes being parallel to the base plane xy. Likewise, the absorption zone 2 is fully contained in the superposed planes also containing a part of the charge zone 6 when it is present, these planes being parallel to the base plane xy.

Thus, the multiplication zone 3 or the charge zone 6 if it is present, is not situated directly above or below, in other words, above or below, the absorption zone along a direction z, perpendicular to the base plane xy.

The absorption zone 2 and the multiplication zone 3, extend respectively along a curved portion of a circuit a and a curved portion of a circuit m. The first electrode 4 and the second electrode 5 extend respectively along a curved portion of a circuit e1 and a curved portion of a circuit e2. In projection over the base plane xy:
    said curved portions of said circuits a, m and e2 are parallel to one another over a part at least of the respective lengths thereof, and
    the first electrode 4 is situated inside the curved portion of the circuit a of the absorption zone 2,
    the curved portion of the circuit a of the absorption zone 2 is situated inside the curved portion of the circuit m of the multiplication zone 3,
    the curved portion of the circuit m of the multiplication zone 3 is situated inside the curved portion of the circuit e2 of the second electrode 5.

According to a non-limiting example, in projection over the base plane (xy), the absorption zone 2 is situated remotely from the multiplication zone 3.

Figure 2A:
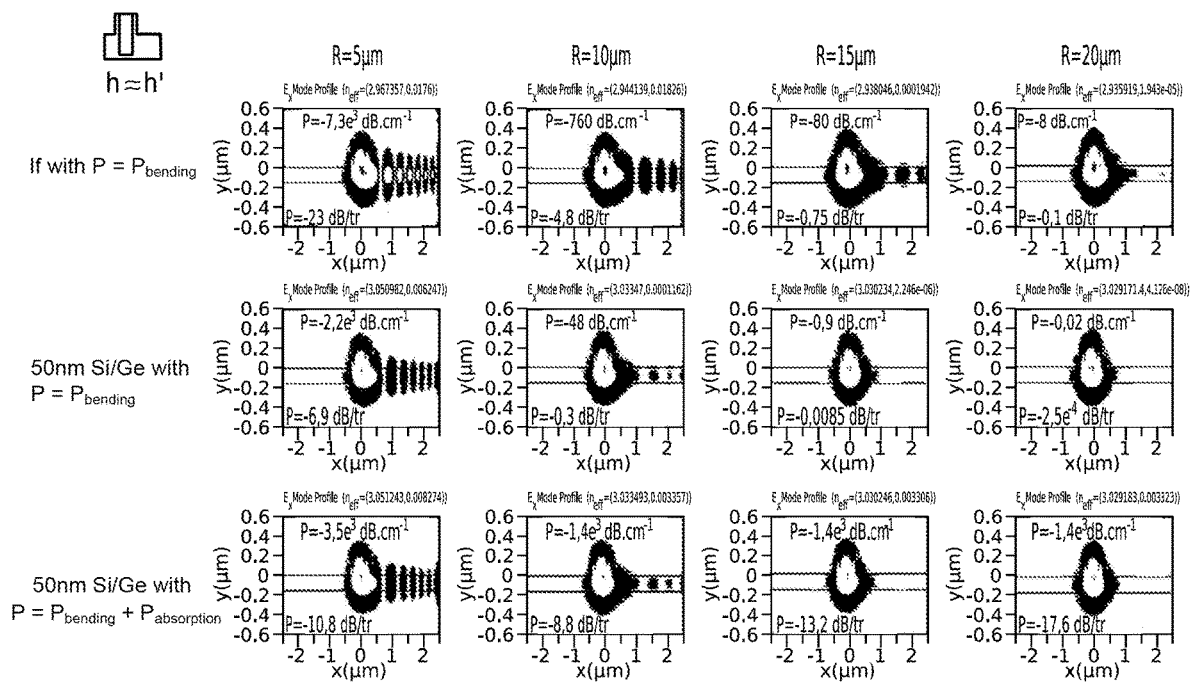
FIG. 2a illustrates a simulation of the optical losses within a ring-shaped guide according to an embodiment of the present invention.
Figure 2B:
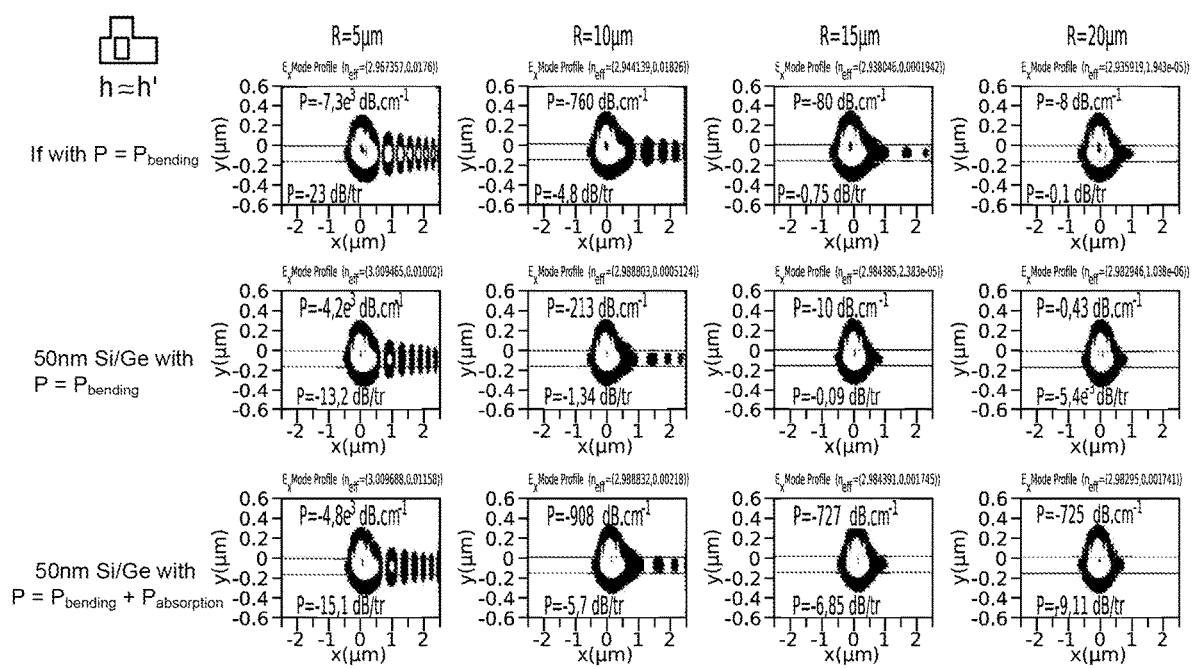
FIG. 2b illustrates a simulation of the optical losses within a ring-shaped guide according to another embodiment of the present invention.

FIGS. 2a and 2b illustrate the simulation of the confinement of a mode k of propagation of a luminous flux within the ring-shaped RIB waveguide 10, for different configurations of said waveguide 10.

In particular, the simulations are carried out for a luminous flux having a wavelength $\lambda=1.31$ μm. For this wavelength, the refraction indexes of silicon $n_{Si}$ and of germanium $n_{Ge}$ can be set from empirical assessments at: $n_{Si}=3.506$ and $n_{Ge}=4.3+i.0.031$.

The simulations are carried out for different bend radii R, in this example: 5 μm, 10 μm, 15 μm and 20 μm.

Simulations are further carried out:
    for a core 11 of the waveguide 10 made of pure crystalline silicon, by integrating losses by bending (over a first line called "Si with $P=P_{bending}$"),
    for a core made of silicon comprising an absorption zone 2 made of germanium of width L=50 nm, by integrating losses by bending (over a second line called "50 nm Si/Ge with $P=P_{bending}$"), and
    for a core made of silicon comprising an absorption zone 2 made of germanium of width L=50 nm, by integrating losses by bending and losses by absorption (over a third line called "50 nm Si/Ge with $P=P_{bending}+P_{absorption}$").

The losses P (dB·cm$^{-1}$) are calculated from the imaginary loss of the actual index of the mode k, according to the formula:

$$P = -\frac{40.\pi.k}{\lambda.\ln 10}$$

FIG. 2a shows simulations carried out in the case where the absorption zone 2 is "crossing", as defined above, in other words, for h≈h'.

FIG. 2b shows simulations carried out in the case where the absorption zone 2 is "non-crossing", as defined above, preferably with h≈h".

It appears, by comparison between the first and second line for each of the figures, that losses by bending in a waveguide 10 of which the core 11 comprises an absorption zone 2 made of germanium are highly decreased with respect to the losses by bending in a waveguide 10 of the same geometry of which the core 11 is made of pure silicon.

The presence of germanium advantageously contributes to guiding the luminous flux within the core of the edge guide, although the small width L=50 nm of the absorption zone 2 is insufficient to guide the luminous flux by index contrast.

This unplanned effect can enable to size a ring-shaped RIB waveguide 10 having a decreased bend radius.

In particular, in "crossing" configuration for h≈h' (FIG. 2a), the waveguide can advantageously have a bend radius R=10 µm.

Alternatively, for h≈h" (FIG. 2b), the waveguide can advantageously have a bend radius R=15 µm.

Simulations (not illustrated) carried out for a luminous flux having a wavelength λ=1.55 µm and for indexes of $n_{Si}$=3.47 and $n_{Ge}$=4.3+i.0.0049 show that losses by absorption of germanium are smaller in this case, around 1 dB/turn. In particular, several turns within the ring-shaped RIB guide 10 can be required to absorb all of the luminous flux.

At this wavelength, losses by bending increase.
Consequently, for λ=1.55 µm:
  for h≈h' (in "crossing" configuration), the waveguide 10 can advantageously have a bend radius R=15 µm.
  for h≈h" (in "non-crossing" configuration), the waveguide 10 can advantageously have a bend radius R=20 µm.

In order to inject the luminous flux within the waveguide 10, an inlet guide 20 can be coupled with said waveguide 10.

This coupling can be a standard evanescent coupling, in other words, that the two guides 10, 20 can be separated from one another by a distance less than the wavelength of the luminous flux.

This distance is preferably adjusted in order to obtain a critical coupling, such that all of the luminous flux propagating in the inlet guide 20 is absorbed by the waveguide 10.

This critical coupling distance can in particular be obtained using FDTD (Finite Difference Time Domain) optical simulation methods.

Generally, in the scope of the present invention, the photodiode has dimensional parameter enabling the luminous flux to detect the carrying out of several turns of the closed circuit defined by the waveguide. Thus, according to the parameters of the luminous flux (such as wavelength and power, in particular), the following dimensional parameters of the photodiode are adapted, in order to enable the luminous flux to carry out several circuit turns: shape of the circuit, bend radius/radii, shape of the core, volume of germanium, coupling distance between the inlet guide and the waveguide.

In reference to FIGS. 3a and 3b, a first electrode 4 of the photodiode 1 can extend, in projection over the base plane xy, in an inner zone of the waveguide 10 delimited by the circle of radius R'.

This first electrode 4 can have a disc or ring shape, for example.

A second electrode 5 of the photodiode 1 can extend, in projection over the base plane xy, in an outer zone of the waveguide 10 beyond the circle of radius R".

The first and second electrodes 4, 5 preferably extend in an upper layer surmounting a base layer comprising the slab of the waveguide 10.

Over a first angular portion of the waveguide 10, the first 4 and second 5 electrodes are disposed on either side of the waveguide 10, along a direction parallel to the plane xy and perpendicular to the main direction of the luminous flux in the waveguide 10.

Over a second angular portion of the waveguide 10, the first 4 and second electrodes cannot be disposed on either side of the waveguide 10, in order to facilitate the coupling between the inlet guide 20 and the waveguide 10, for example. As illustrated in FIGS. 3a and 3b, the second electrode 5 can have a 0 shape, in order to store a space for the inlet guide 20.

The first and second electrodes 4, 5 are preferably metal and deposited on a first and a second contact zone 41, 51 respectively.

These first and second contact zones 41, 51 can be made of silicon, respectively doped p+ and n+.

The collection of electrons is made preferably by the second electrode 5. The electrons can travel radially between the absorption zone 2 and the second electrode 5.

The bandwidth of the photodiode 1 is affected by the travel time of the carriers (electrons and holes), and by a time characteristic of relaxation τ of the photodiode 1. This bandwidth is proportional to the transfer function $H_{photo}$ of the photodiode 1.

The transfer function linked to the travel of the carriers is written:

$$H_{tr} = \left[\frac{1}{(\omega\tau_n)^2}(1-e^{j\omega\tau_n}) - \frac{1}{j\omega\tau_n}\right] + \left[\frac{1}{(\omega\tau_p)^2}(1-e^{j\omega\tau_p}) - \frac{1}{j\omega\tau_p}\right]$$

Where $\tau_{n,p}$ are respectively the travel times of the electrons and the holes.

The time characteristic of relaxation τ enables to model a part of the photodiode 1 by an RC system, with τ=RC, where R and C are respectively the resistance and the capacity of said part of the photodiode 1.

Subsequently, the transfer function linked to this RC system is written:

$$H_{RC} = \frac{1}{1 + j(R_S + R_L)C_{eq}\omega}$$

Where $R_S$ is the resistance of the doped zones and of the electrodes, and $R_L$ represents a charge resistance of an outer circuit for measuring current. The capacity $C_{eq}$ is: $C_{eq}=\epsilon Hl/L$, with H=h+h' the height of the core 11 of the guide 10, l the length of the second electrode 5, ε the dielectric permittivity of Ge, and L the width of the absorption zone 2.

The total transfer function of the photodiode 1 is written:

$H_{photo}=H_{tr}H_{RC}$

In order to maximise $H_{photo}$ therefore the bandwidth of the photodiode 1, the capacity $C_{eq}$ must be minimised.

In particular, the length l of the second electrode 5 can advantageously be reduced by conserving a total absorption in the absorption zone 2 and an effective collection of electrons.

To do this, the length l of the second electrode 5 is preferably substantially less than or equal to the outer perimeter of the ring guide 10, l≤2kπR" with 0.95≤k≤1.05.

A luminous flux covering the waveguide 10 over at least one ring turn before being totally absorbed will firstly generate electrons during a first passage in a first place of the absorption zone 2, then secondly electrons during a second passage to said first place, for example.

Thus, the collection of electrons generated successively during these first and second passages is done by one same portion of the second electrode 5.

A length l of the second electrode 5 can therefore enable to collect electrons generated over a distance $l_{tot}$ covered by the luminous flux within the absorption zone 2, such that: $l<l_{tot}$.

The ring guide 10 thus enables to propagate the luminous flux until the latter is totally absorbed by the absorption zone 2, whereas the length of electrode 5 necessary for the collection of electrons can be advantageously less than the distance covered by said luminous flux.

The photodiode 1 is thus configured to totally absorb the luminous flux, while minimising the capacity $C_{eq}$ linked to the length of the electrode 5. The bandwidth of this photodiode 1 can thus be improved.

As indicated above, FIG. 3a illustrates an embodiment wherein the absorption zone 2 forms a complete ring. The luminous flux is therefore absorbed continuously all throughout the path thereof in the waveguide 10.

According to another possibility illustrated in FIG. 3b, the absorption zone 2 forms a ring-shaped portion opposite the second electrode 5.

In particular, an angular sector corresponding to the second angular portion with no second electrode 5 can advantageously have no absorption zone 2. Thus, as illustrated in the cross-section view along the plane zx in FIG. 3b, a cross-section (on the right in the figure) of the core 11 of the waveguide 10 only comprises the material for guiding the luminous flux, in other words, silicon in this example. Another cross-section (on the left in the figure) of the core 11 of the waveguide 10 comprises the material for guiding the luminous flux, as well as the absorption zone 2.

In this manner, the luminous flux propagating in said second angular portion is not absorbed, in order to not uselessly generate electrons, said electrons could not moreover be collected.

Furthermore, the flux is not absorbed, it can cover a larger distance within the guide 10, said distance could advantageously exceed one turn of the ring-shaped RIB guide 10.

The angular sector can have an angle α of between 30° and 180°.

This configuration enables to increase the effectiveness and efficiency of the photodiode 1, while further benefiting the different advantages presented above.

Advantageously, in particular to reduce losses, the photodiode comprises the electrodes 4 and 5 only.

Figure 4:
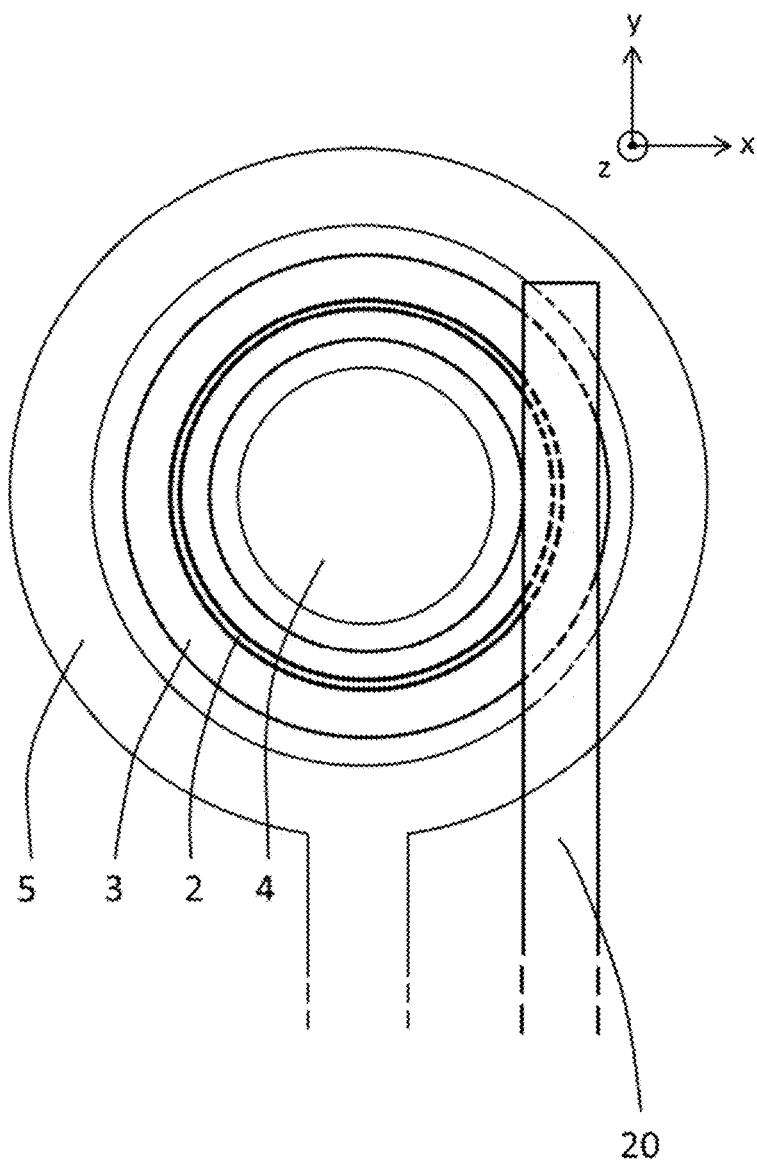
FIG. 4 is a top view of a photodiode according to another embodiment of the present invention, illustrating a specific form of electrodes.
Figure 5:
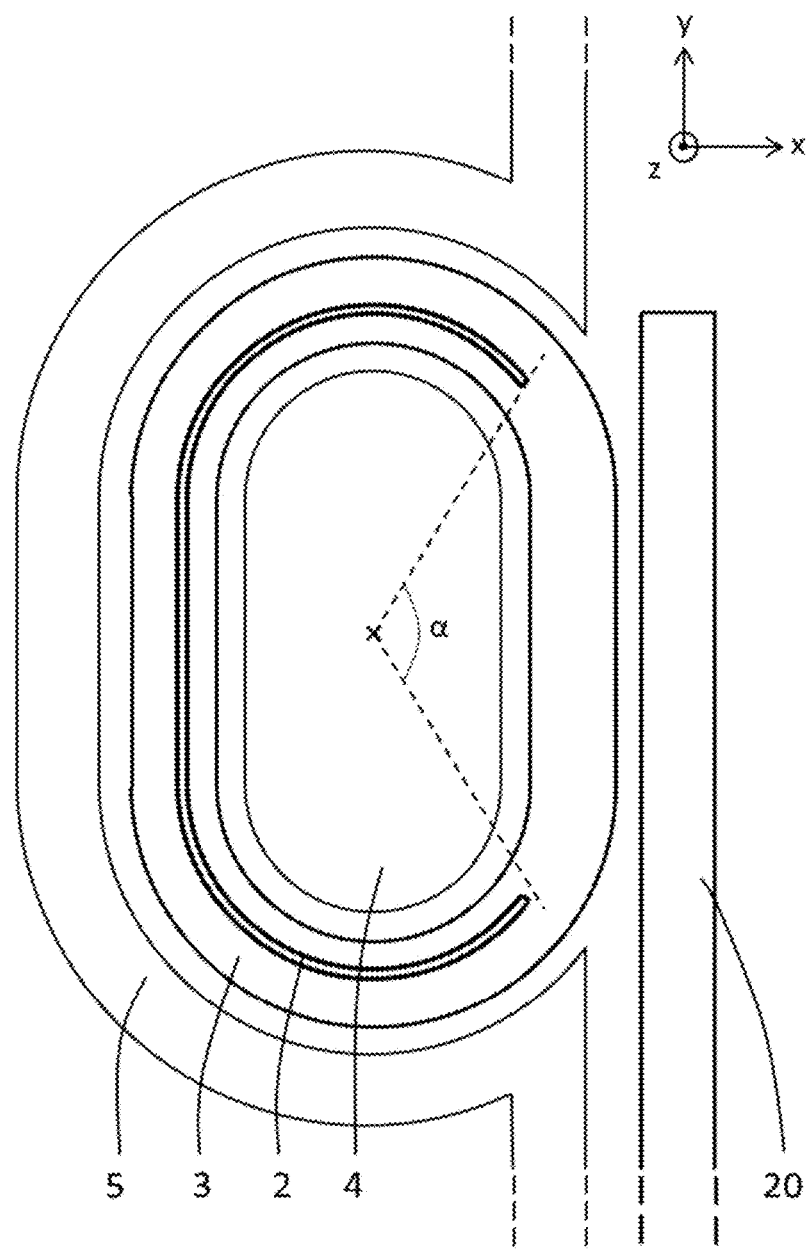
FIG. 5 is a top view of a photodiode according to another embodiment of the present invention wherein the absorption zone and the waveguide form non-circular curves.

Other embodiments of a photodiode 1 are illustrated in FIGS. 4 and 5.

Only the separate characteristics of the first embodiment are defined below, the other characteristics not defined being considered as identical to those of the first embodiment.

FIG. 4 illustrates a photodiode 1 comprising a second annular electrode 5. This second annular electrode 5 forms a closed curve which fully surrounds the waveguide 10. This annular electrode 5 can advantageously enable to improve the collection of electrons.

In this configuration, the first electrode 4, the waveguide 10 and the second electrode 5 are concentric.

Furthermore, the absorption zone 2 and the multiplication zone 3 are annular. The second electrode 5 fully surrounds the curved closed circuit formed by the absorption zone 2.

The inlet guide 20 can advantageously be positioned in a plane parallel to the base plane xy, at an altitude along z greater than the altitude of the base plane xy. The inlet guide 20 is thus positioned above the ring guide 10.

FIG. 5 illustrates a photodiode 1, of which the waveguide 10 forms an oval and has at least one first straight-lined portion combined with at least one first curvilinear or curved portion, so as to form a closed circuit.

The absorption and multiplication zones 2, 3, and the first and second electrodes 4, 5 can each also have at least one straight-lined portion parallel to said at least one first straight-lined portion, and at least one curvilinear portion parallel to said at least one first curvilinear portion.

In particular, the waveguide 10 can have an oblong shape.

The inlet guide 20 can advantageously be partially parallel to a portion of the oval, preferably straight-lined, so as to improve the coupling with the waveguide 10. Indeed, the coupling between said waveguide 10 and inlet guide 20 is thus done over a coupling length greater than that existing between two guides without parallel portions. For one same coupling rate, this greater coupling length proportionally enables to increase an extending distance between the two guides 10, 20. An increase in the extending distance enables to have a better control during the technological steps of producing these guides 10, 20. In particular the relative imprecision over the extending distance is smaller when this extending distance increases. With this configuration, the coupling rate can therefore be controlled more precisely, in particular so as to achieve critical coupling (coupling rate of around 100%). Critical coupling, in particular, enables to transfer all of the luminous flux propagating in the inlet guide 20 into the waveguide 10.

Figure 6A:
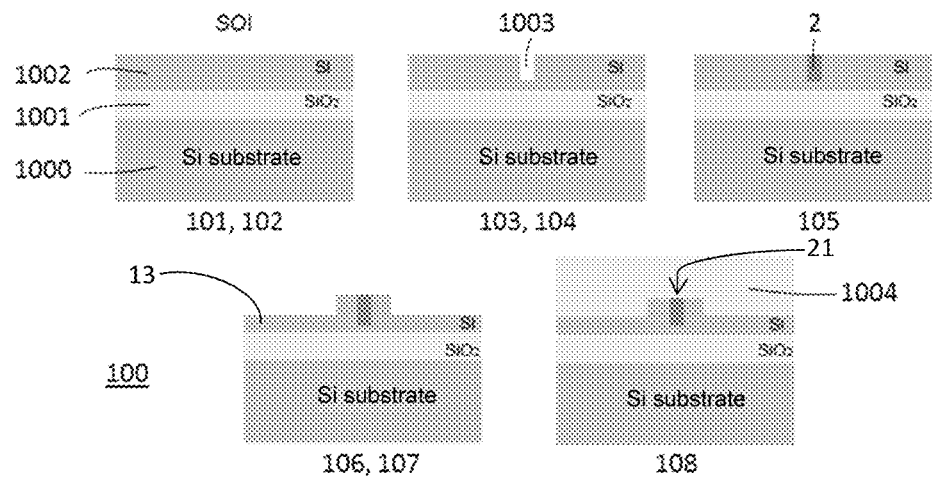
FIG. 6a illustrates steps of a method for producing a photodiode according to an embodiment of the present invention.
Figure 6B:
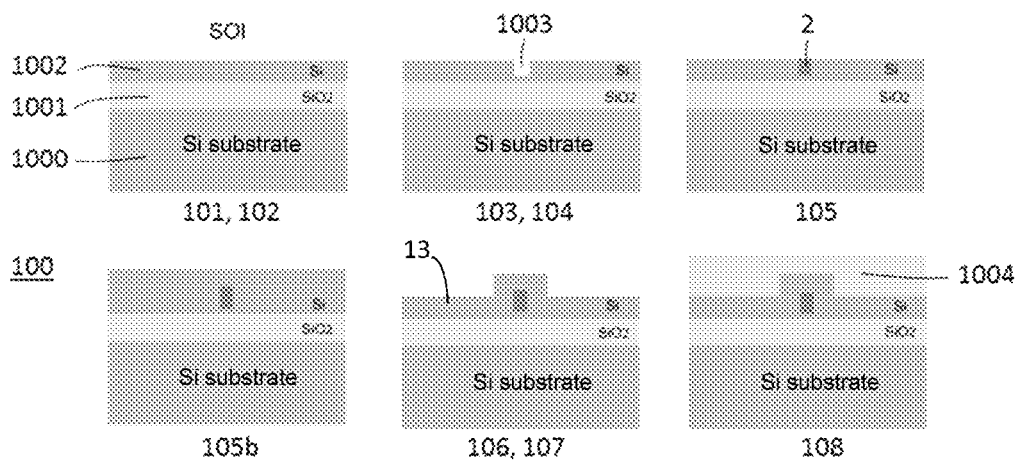
FIG. 6b illustrates steps of a method for producing a photodiode according to another embodiment of the present invention.

In reference to FIGS. 6a, 6b, two examples of a method of producing a photodiode according to the invention will now be defined.

A first example of a production method is illustrated in FIG. 6a. This method comprises at least the following steps:

Providing 101 a stack comprising a support substrate 1000 surmounted on an insulating layer 1001, itself surmounted on an upper silicon layer 1002. Typically, this stack constitutes a silicon-on-insulator (SOI)-type substrate. The support substrate 1000 is typically made of silicon and the insulating layer 1001 is a buried oxide layer.

Ionic implantation 102 of the SOI substrate at the level of the contact zones 41, 51. The contact zone 41 can be implanted so as to have a doping p+ and the contact zone 51 can be implanted so as to have a doping n+.

Lithography 103 so as to define the limits of the absorption zone 2 in a plane xy. The lithography is done such that the absorption zone 2 forms, in the plane xy, a closed or open curve.

Partial etching 104 of the silicon along the axis z so as to form a cavity 1003. The etching is stopped sufficiently early to conserve a residual thickness of silicon in the bottom of the cavity 1003. In this sense, the etching 104 is a partial etching. This residual thickness enables to facilitate the growth of germanium through epitaxy during the following step. The etching can be done by RIE dry etching, for example.

Epitaxy 105 of germanium in said cavity so as to form the absorption zone 2.

Chemical-mechanical polishing (CMP) parallel to the plane xy.

Lithography 106 so as to define the limits for the upper part of the core 11 of the RIB waveguide 10 along a ring comprising the absorption zone 2.

Etching 107 of the silicon so as to form said upper part of the core 11 of the waveguide 10. The lower portion of the silicon layer thus defines the slab 13.

Encapsulation 108 of the core 11 of the waveguide 10 by depositing an encapsulation layer 1004 preferably made of $SiO_2$.

Forming the first and second electrodes 4, 5 at the level of the contact zones 41, 51.

The steps 106 and 107 defined above are advantageous to obtain a configuration with the "crossing" type absorption zone 2, in other words, wherein the upper face of the absorption zone 2 is not covered by silicon, preferably intrinsic silicon.

Thus, in this embodiment, the absorption zone 2 has a part covered and preferably in contact with the silicon and a part directly in contact with the encapsulation layer 1004. Thus, the absorption zone 2 compensates for the silicon. The part directly in contact with the encapsulation layer 1004 is preferably the upper part 21 of the absorption zone 2.

Advantageously, in this embodiment, the multiplication layer 3 is fully situated in the slab 13. Likewise, the charge zone 6, in the case where it is present, is fully situated in the slab 13.

In projection over the base plane (xy), the multiplication zone 3 and the first electrode 4 are situated on either side of the absorption zone 2.

The production method 100 can also comprise the following steps, which are advantageous for obtaining a configuration with the "non-crossing" type absorption zone 2, in other words, wherein the upper face of the absorption zone 2 is covered by silicon (the absorption zone 2 thus having a height h≈h"):
  deposit of an additional layer of silicon through epitaxy 105b of silicon after the epitaxy 105 of germanium step and the optional polishing step, and
  Chemical-mechanical polishing before the lithography step 106.

During the lithography carried out so as to define the shape of the waveguide 10, and thus the slab 13, it is done so as to conserve the silicon on the upper face of the absorption layer 2. The latter is thus found fully encapsulated in the silicon. The absorption layer 2 does not compensate for the silicon layer of the core. The absorption layer 2 is not in contact with the encapsulation layer 1004 forming a part of the sleeve.

The method 100 can also comprise a plurality of ionic implantation steps, so as to form the doped p charge zone 6.

Advantageously, the photodiodes produced according to the methods defined in reference to FIGS. 6a and 6b enabling the obtaining of lateral photodiodes. The characteristics and advantages mentioned above relative to lateral photodiodes, in particular mentioned in reference to FIG. 1, are naturally applicable to photodiodes produced according to the methods defined in reference to FIGS. 6a and 6b.

Thus, the absorption layer 2, the multiplication layer 3 (and the charge zone 6), if it is present, are partially at least contained in identical planes, parallel to the base plane xy, and are concentric in these planes.

Thus, over a portion at least of the height thereof and in each point of the curved closed circuit c, the absorption zone 2 is opposite, preferably fully opposite, the multiplication zone 3 (and the charge zone 6 if it is present) along a direction parallel to the base plane xy and perpendicular to the tangent to the curved closed circuit c in this point.

Likewise, the multiplication zone 3 or the charge zone 6, if it is present, is not situated directly above or below, in other words, above or below, the absorption zone along a direction z, perpendicular to the base plane xy.

In view of the description which precedes, it clearly appears that the invention proposes a particularly effective solution to obtain an avalanche photodiode having an improved compacity and an improved bandwidth, while limiting the excess noise factor.

The invention is not limited to the embodiments defined above, and extends to all embodiments covered by the claims.

The invention claimed is:

1. An avalanche photodiode, comprising:
  an absorption zone,
  a multiplication zone,
  a first electrode,
  a second electrode, and
  a waveguide forming, in projection along a base plane, a curved closed circuit c, capable of guiding a luminous flux over several turns of the curbed closed circuit c,
  wherein the absorption zone extends over at least a portion of the curved closed circuit c,
  the multiplication zone, the first electrode and the second electrode extend along at least a part of the curved closed circuit c,
  the avalanche photodiode is a lateral SAM avalanche photodiode,
  wherein, an outer vertical flank of the absorption zone is opposite an inner vertical flank of the multiplication zone in each point of the curved closed circuit c, along a direction parallel to the base plane over heights of the absorption zone and the multiplication zone,
  wherein the multiplication zone and the absorption zone extend, in projection over the base plane concentrically,
  wherein, at least in projection in the base plane:
    the first electrode and the second electrode are disposed on either side of the absorption zone and the multiplication zone, and
    the first electrode and the multiplication zone are disposed on either side of the absorption zone.

2. The avalanche photodiode according to claim 1, wherein the absorption zone, the multiplication zone and the second electrode extend respectively along a curved portion of a circuit a, a curved portion of a circuit m, and a curved portion of a circuit e2, the curved portions of the circuits a, m and e2 being, in projection over the base plane, parallel to one another over at least a part of respective lengths thereof, and
wherein in projection over the base plane:
  the first electrode is situated inside the curved portion of the circuit a of the absorption zone,
  the curved portion of the circuit a of the absorption zone is situated inside the curved portion of the circuit m of the multiplication zone,
  the curved portion of the circuit m of the multiplication zone is situated inside the curved portion of the circuit e2 of the second electrode.

3. The avalanche photodiode according to claim 1, wherein the absorption zone forms at least one portion of a first oval circuit and
the multiplication zone forms at least one portion of a second oval circuit, such that barycenters of the first oval circuit and second oval circuit are combined.

4. The avalanche photodiode according to claim 3, wherein the first oval circuit and the second oval circuit are circle circuits.

5. The avalanche photodiode according to claim 4, wherein the circle circuits have a bend radius of between 5 µm and 20 µm.

6. The avalanche photodiode according to claim 1, wherein the waveguide comprises a core and a sleeve and
  wherein the absorption zone is situated at least partially at a level of the core.

7. The avalanche photodiode according to claim 6, wherein the core comprises a guide material different from a material of the absorption zone and
   wherein the guide material fully surrounds the absorption zone.

8. The avalanche photodiode according to claim 7, wherein the absorption zone has a height h substantially equal to a height h' of the multiplication zone,
   wherein the absorption zone and the multiplication zone are opposite one another along a direction parallel to the base plane and perpendicular to a tangent to the curved closed circuit c, and
   wherein the absorption zone and the multiplication zone are contained in planes parallel to one another and parallel to the base plane and the heights h and h', being measured along a direction which is perpendicular to the base plane.

9. The avalanche photodiode according to claim 1, wherein the waveguide is an edge (RIB) type guide.

10. The avalanche photodiode according to claim 1, wherein the absorption zone forms a curved closed circuit such that the waveguide has a portion free from the absorption zone, and
    wherein the first electrode and the second electrode are not situated on either side of the portion of the waveguide free from the absorption zone.

11. The avalanche photodiode according to claim 1, wherein the absorption zone has a width L<200 nm, and the width L, in one given point, being measured along a direction which is parallel to the base plane and which is perpendicular to a tangent, in this given point, to the absorption zone.

12. The avalanche photodiode according to claim 1, wherein the absorption zone, in projection over the base plane, forms a first curved circuit having a length $l_1$, and the curved closed circuit c has a length $l_c$, the lengths $l_1$ and $l_c$ being measured in the base plane, such that:
   $0.5 \cdot l_c \leq l_1 \leq 1 \cdot l_c$.

13. The avalanche photodiode according to claim 1, wherein the first electrode is situated inside the curved closed circuit c and
   the second electrode is situated outside the curved closed circuit c in projection in the base plane.

14. The avalanche photodiode according to claim 1, further comprising a charge zone interleaved between the absorption zone and the multiplication zone.

15. The avalanche photodiode according to claim 1, wherein the absorption zone is in contact with the multiplication zone.

16. The avalanche photodiode according to claim 1, further comprising an inlet guide configured to form an evanescent coupling with the waveguide so as to guide a luminous flux from outside of the waveguide to inside of the waveguide.

17. An avalanche photodiode, comprising:
   an absorption zone,
   a multiplication zone,
   a first electrode,
   a second electrode, and
   a waveguide forming, in projection along a base plane, a curved closed circuit c, capable of guiding a luminous flux over several turns of the curbed closed circuit c,
   wherein the absorption zone extends over at least a portion of the curved closed circuit c,
   the multiplication zone, the first electrode and the second electrode extend along at least a part of the curved closed circuit c,
   the waveguide comprises a core and a sleeve,
   the absorption zone is situated at least partially at a level of the core,
   the core comprises a guide material different from a material of the absorption zone, and
   the guide material surrounds only one part of the absorption zone, and the sleeve surrounds one complementary part of the absorption zone by being in contact with the complementary part of the absorption zone.

18. An avalanche photodiode, comprising:
   an absorption zone,
   a multiplication zone,
   a first electrode,
   a second electrode, and
   a waveguide forming, in projection along a base plane, a curved closed circuit c, capable of guiding a luminous flux over several turns of the curbed closed circuit c,
   wherein the absorption zone extends over at least a portion of the curved closed circuit c,
   the multiplication zone, the first electrode and the second electrode extend along at least a part of the curved closed circuit c,
   the absorption zone forms a curved closed circuit, and
   the first electrode and the second electrode are situated on either side of the absorption zone, the second electrode fully surrounding the curved closed circuit formed by the absorption zone.

19. A method for producing an avalanche photodiode, the method comprising:
   providing a silicon on an insulator type substrate comprising an upper layer made of silicon,
   performing lithography so as to define limits of an absorption zone in a plane,
   etching an axis of only a part of a thickness of the upper layer, so as to form a cavity delimited by the limits of the absorption zone defined by the performing lithography,
   depositing germanium in the cavity so as to form the absorption zone,
   performing lithography so as to define limits of a waveguide according to a curved closed circuit c, comprising the absorption zone,
   etching along an axis of a part of a thickness of the silicon surrounding limits of the waveguide, so as to form at least one part of the waveguide,
   forming first and second electrodes at a level of contact zones situated on either side of the waveguide,
   wherein the avalanche photodiode, comprising:
   the absorption zone,
   a multiplication zone,
   a first electrode,
   a second electrode, and
   the waveguide forming, in projection along a base plane, the curved closed circuit c, capable of guiding a luminous flux over several turns of the curved closed circuit c, and
   wherein the absorption zone extends over at least a portion of the curved closed circuit c, and
   the multiplication zone, the first electrode and the second electrode extend along at least a part of the curved closed circuit c.

* * * * *